(12) United States Patent
Otsuka

(10) Patent No.: US 12,454,419 B2
(45) Date of Patent: Oct. 28, 2025

(54) ARTICLE TRANSPORT FACILITY

(71) Applicant: Daifuku Co., Ltd., Osaka (JP)

(72) Inventor: Hiroshi Otsuka, Hinocho (JP)

(73) Assignee: Daifuku Co., Ltd., Osaka (JP)

( * ) Notice: Subject to any disclaimer, the term of this patent is extended or adjusted under 35 U.S.C. 154(b) by 575 days.

(21) Appl. No.: 18/068,226

(22) Filed: Dec. 19, 2022

(65) Prior Publication Data

US 2023/0192412 A1 Jun. 22, 2023

(30) Foreign Application Priority Data

Dec. 20, 2021 (JP) .................. 2021-206439

(51) Int. Cl.
| | |
|---|---|
| *B65G 35/06* | (2006.01) |
| *B65G 35/00* | (2006.01) |
| *H01L 21/67* | (2006.01) |
| *H01L 21/673* | (2006.01) |
| *H01L 21/677* | (2006.01) |

(52) U.S. Cl.
CPC ............ *B65G 35/06* (2013.01); *B65G 35/00* (2013.01); *H01L 21/67259* (2013.01); *H01L 21/67294* (2013.01); *H01L 21/673* (2013.01); *H01L 21/6735* (2013.01); *H01L 21/677* (2013.01); *H01L 21/67706* (2013.01); *H01L 21/67715* (2013.01); *H01L 21/67724* (2013.01); *H01L 21/6773* (2013.01); *H01L 21/67733* (2013.01)

(58) Field of Classification Search
CPC ... B65G 35/06; B65G 35/00; H01L 21/67706; H01L 21/67715; H01L 21/67724; H01L 21/67733; H01L 21/6735; H01L 21/67259; H01L 21/67294; H01L 21/6773; H01L 21/677; H01L 21/673
USPC ..................................... 246/182 R
See application file for complete search history.

(56) References Cited

U.S. PATENT DOCUMENTS

| | | | |
|---|---|---|---|
| 6,290,188 B1 * | 9/2001 | Bassett | ............... B61L 23/34 246/182 R |
| 9,902,565 B2 * | 2/2018 | Murakami | ............... B60L 5/38 |
| 2010/0242783 A1 * | 9/2010 | Oguro | ............... H01L 21/67727 104/91 |

(Continued)

FOREIGN PATENT DOCUMENTS

| | | | | |
|---|---|---|---|---|
| CN | 101863368 A | * | 10/2010 | ......... B65G 49/063 |
| CN | 108861265 A | * | 11/2018 | ......... B65G 1/1373 |

(Continued)

*Primary Examiner* — S. Joseph Morano
*Assistant Examiner* — James William Jones
(74) *Attorney, Agent, or Firm* — The Webb Law Firm

(57) ABSTRACT

A determination section determines that a transport vehicle entered a curved zone from a straight zone based on a front-rear rotation speed difference between the rotation speed of a first rear wheel and a second rear wheel and the rotation speed of at least either a first or second front wheel. A measurement section measures a distance-to-curve, which is the distance that the transport vehicle travels from when a detector detects a detection target until when the determination section determines that the transport vehicle entered the curved zone from the straight zone. If the detector detects a curve ahead detection target while curve ahead information is stored in a storage section, a travel control section executes speed change control before or when the transport vehicle enters the curved zone.

4 Claims, 5 Drawing Sheets

(56) References Cited

U.S. PATENT DOCUMENTS

2010/0242784 A1\* 9/2010 Oguro ............... H01L 21/67715
                                                      104/130.01
2017/0183154 A1\* 6/2017 Kinugawa ............ B65G 1/0457
2017/0229333 A1\* 8/2017 Kinugawa ............ B61L 25/025

FOREIGN PATENT DOCUMENTS

| CN | 109110361 A | * | 1/2019 | ............ B65G 43/00 |
| CN | 110182511 A | * | 8/2019 | ............ B65G 43/00 |
| CN | 111664884 A | * | 9/2020 | ............ G01S 17/93 |
| JP | 63118811 A | * | 5/1988 | |
| JP | 10201500733 U | * | 11/2015 | |
| TW | 201812495 A | * | 4/2018 | ....... H01L 21/67724 |

\* cited by examiner

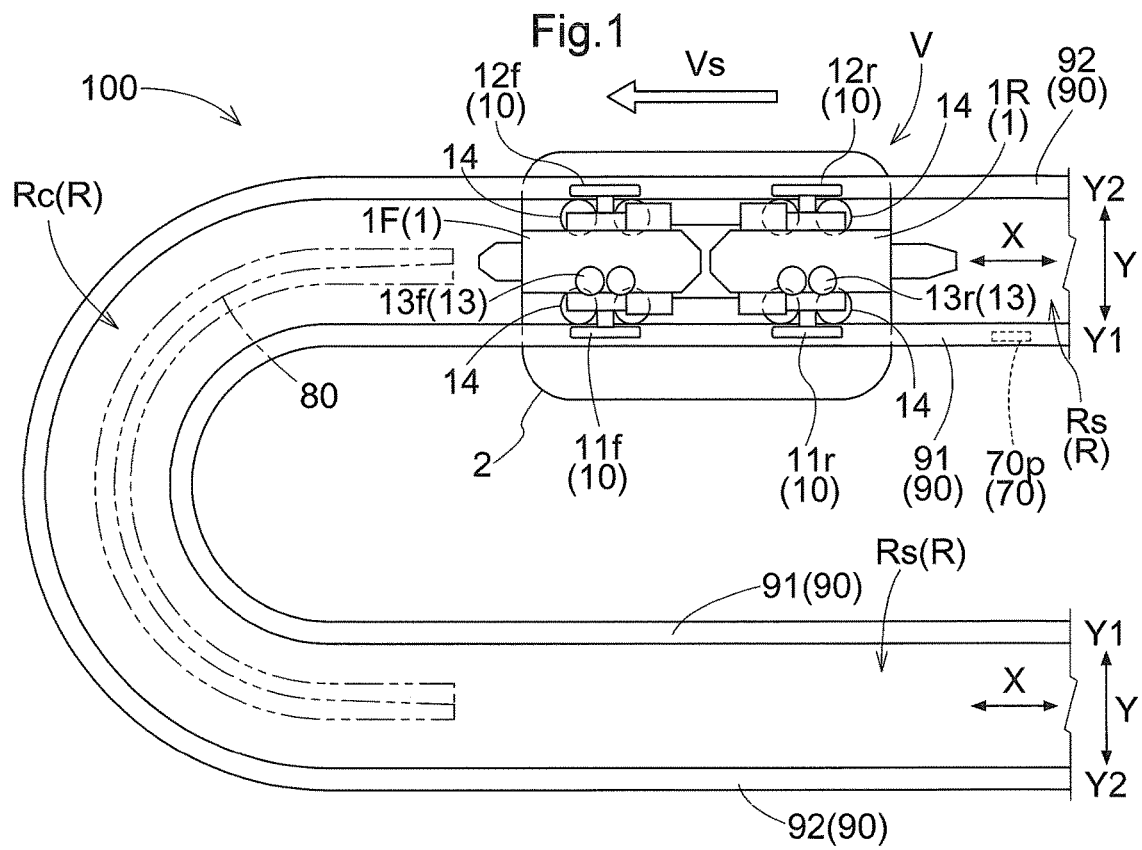
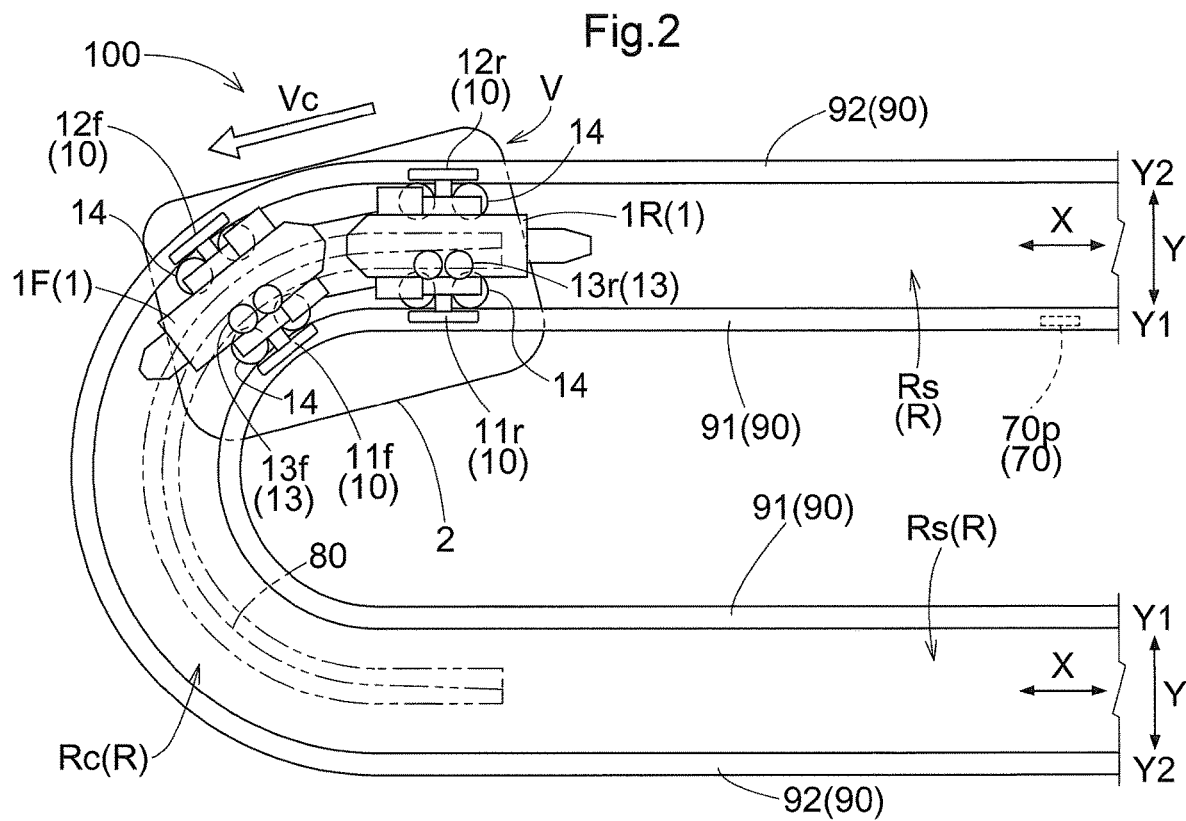

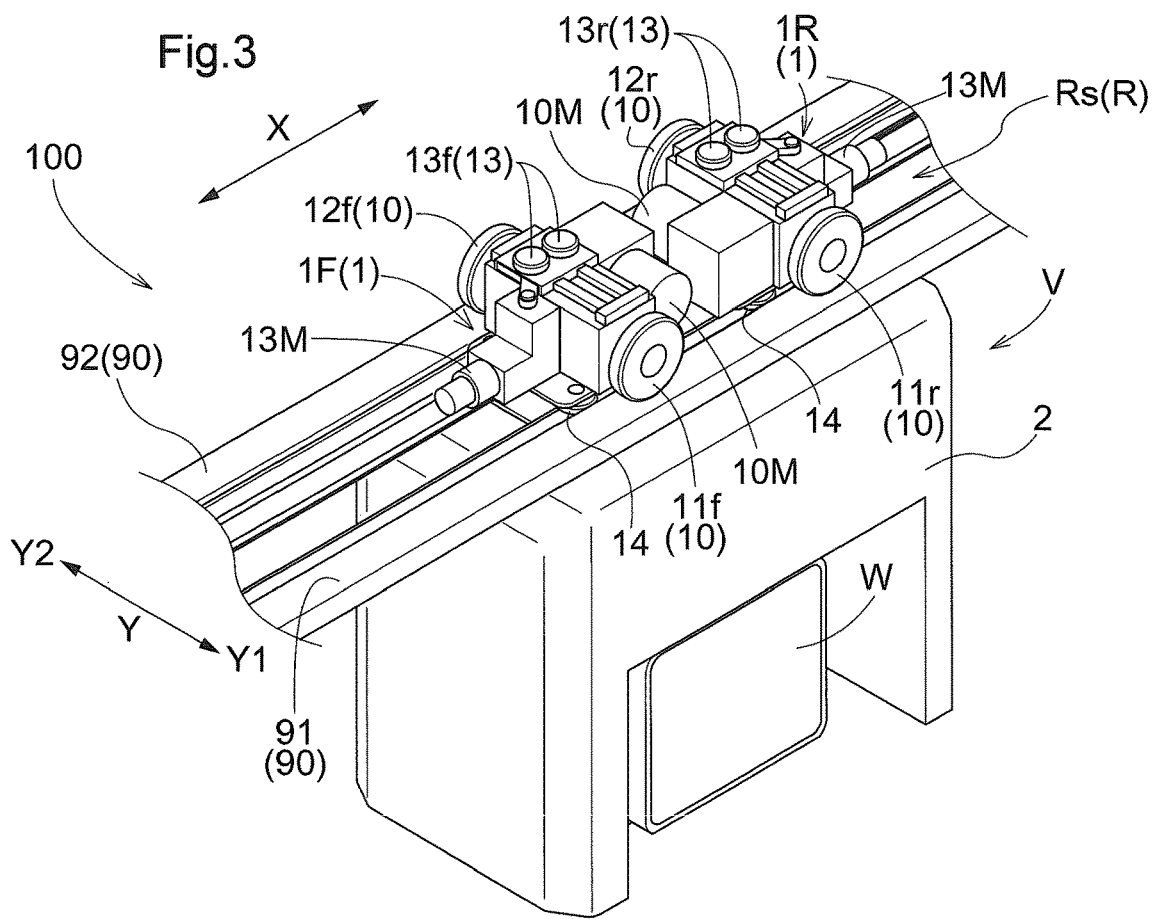
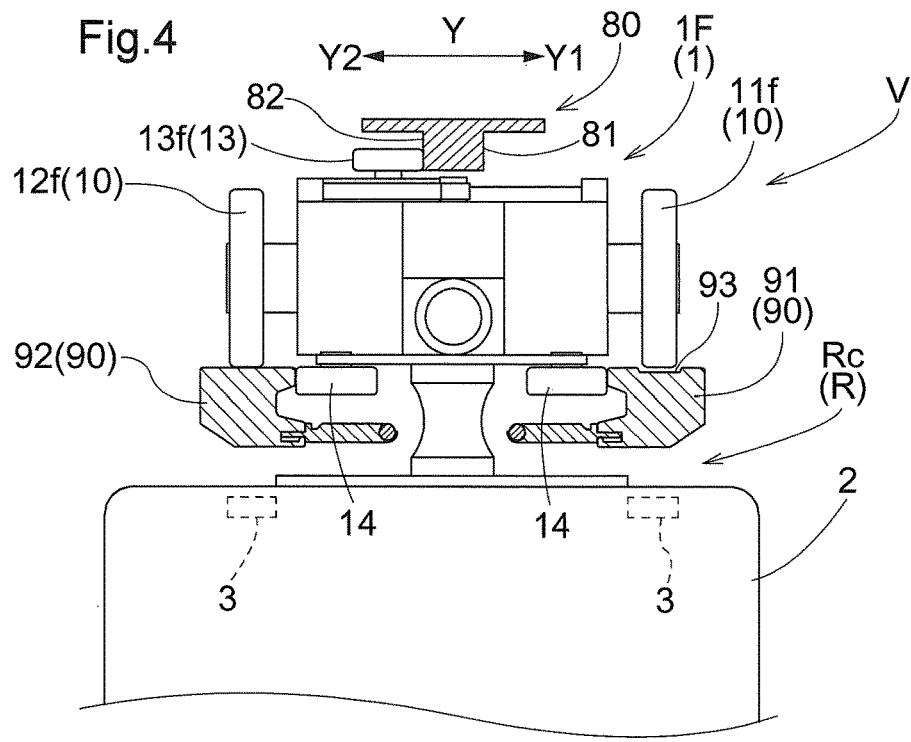

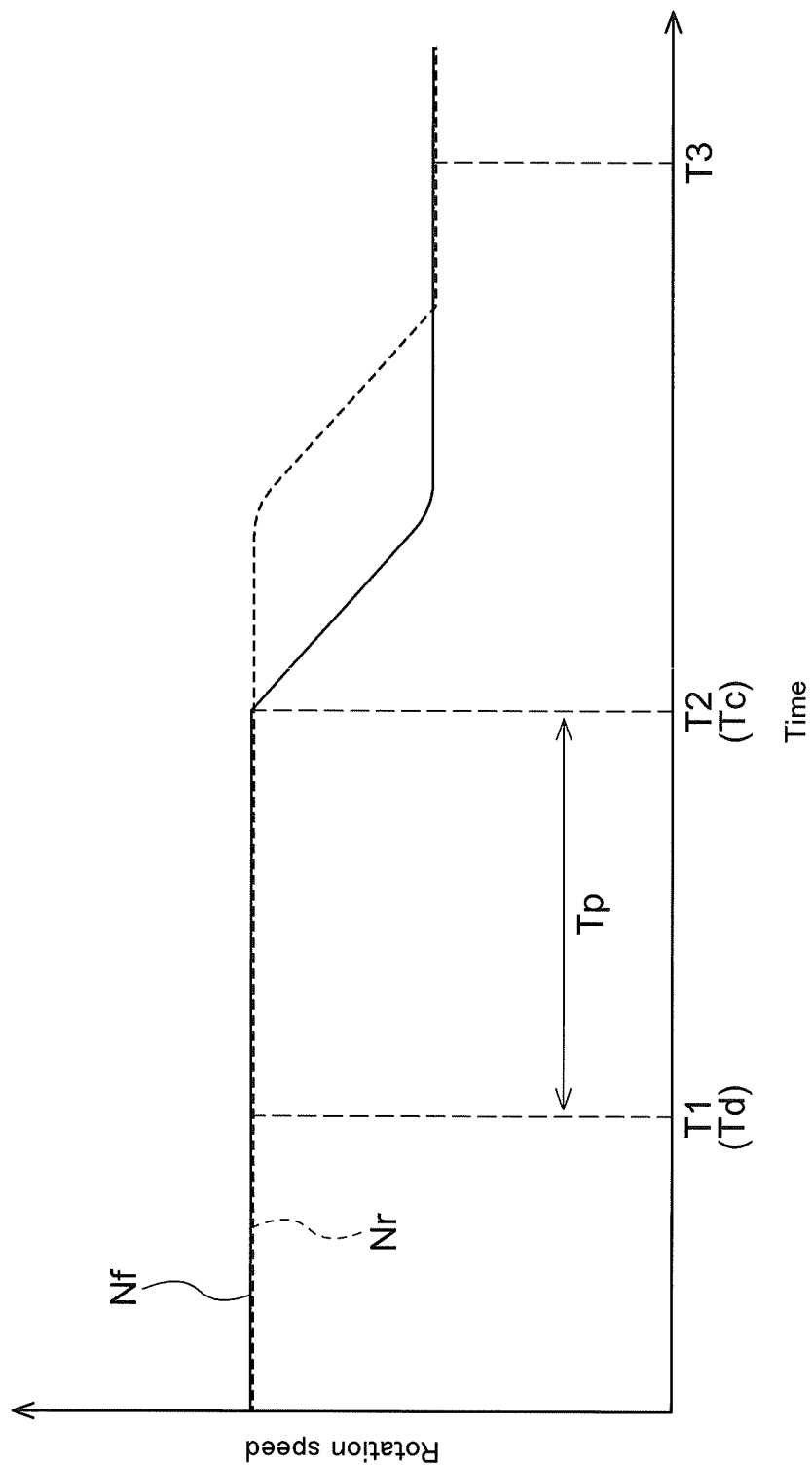

ARTICLE TRANSPORT FACILITY

CROSS-REFERENCE TO RELATED APPLICATION

This application claims priority to Japanese Patent Application No. 2021-206439 filed Dec. 20, 2021, the disclosure of which is hereby incorporated by reference in its entirety.

BACKGROUND OF THE INVENTION

1. Field of the Invention

The present invention relates to an article transport facility that includes a pair of travel rails extending along a travel route having a straight zone and a curved zone, a transport vehicle that travels along the travel route and transports articles, and a control system that controls the transport vehicle.

2. Description of the Related Art

In such an article transport facility, the traveling speed of a transport vehicle is often different between a straight zone and a curved zone. For example, a traveling speed is set for straight zones, a traveling speed is set for curved zones, and the traveling speed of a transport vehicle is controlled in accordance with the straight zone traveling speed in straight zones and controlled in accordance with the curved zone traveling speed in curved zones. In order to perform such speed control, it is desirable to have accurate information on the positions where the straight zones and the curved zones are provided along the travel route.

For example, JP S63-118811A (Patent Document 1) discloses technology in which information on the fact that a transport vehicle is located at a position in front of an intersection (K), where the travel route branches or merges, is obtained by detecting a mark (m) provided in front of the intersection (K). Also, in the technology disclosed in Patent Document 1, the travel distance of the transport vehicle is detected based on the detection result of a rotary encoder (18) that detects the number of rotations of a traveling wheel (6). According to such technology, by providing a detection target (mark) in front of a curved zone and detecting the distance traveled by the transport vehicle from the detection target, it is possible to determine the timing at which the transport vehicle will enter the curved zone, which is at a predetermined distance from the detection target.

SUMMARY OF THE INVENTION

Note that the distance from the detection target to the curved zone is normally determined by design. However, there is a possibility that the actual location of the detection target deviates from the designed position, for example, and in such a case, there may be a discrepancy between the designed distance and the actual distance from the detection target to the curved zone. If such a discrepancy arises, the speed control, which is performed based on the position of the curved zone according to information held by the transport vehicle, will also be performed at a position that deviates from the actual position of the curved zone.

In view of the above-described actual situation, there is a demand for realization of technology capable of performing highly accurate travel control in accordance with the accurate position of a curved zone.

In view of the foregoing, one aspect of an article transport facility is:

an article transport facility including:
a pair of travel rails extending along a travel route having a straight zone and at least one curved zone;
a transport vehicle configured to travel along the travel route and transport an article; and
a control system configured to control the transport vehicle,
wherein one of the pair of travel rails is a first travel rail on a first side in a width direction orthogonal, when viewed in a vertical direction, to a traveling direction along the travel route, and another one of the pair of travel rails is a second travel rail on a second side in the width direction different from the first side in the width direction,
the transport vehicle includes a plurality of traveling wheels configured to roll on upper surfaces of the pair of travel rails, and a detector configured to detect a detection target on the travel route,
the plurality of traveling wheels include a first front wheel and a second front wheel side by side in the width direction, and a first rear wheel and a second rear wheel side by side in the width direction at positions rearward of the first front wheel and the second front wheel in the traveling direction,
the first front wheel and the first rear wheel are configured to roll on an upper surface of the first travel rail,
the second front wheel and the second rear wheel are configured to roll on an upper surface of the second travel rail,
the control system includes a determination section, a measurement section, a storage processing section, a storage section, and a travel control section,
the determination section is configured to determine that the transport vehicle entered the at least one curved zone from the straight zone, based on a front-rear rotation speed difference between (i) a rotation speed of the first rear wheel and the second rear wheel and (ii) a rotation speed of at least either the first front wheel or the second front wheel,
the measurement section is configured to measure a distance-to-curve indicating a distance the transport vehicle travels from when the detector detects the detection target until when the determination section determines that the transport vehicle entered the at least one curved zone from the straight zone,
the storage processing section is configured to associate the distance-to-curve with unique identification information set for a curve ahead detection target, which is the detection target used for measurement of the distance-to-curve, and store the distance-to-curve and the identification information as curve ahead information in the storage section, and
the travel control section is configured to, in response to the detector detecting the curve ahead detection target while the curve ahead information is stored in the storage section, execute speed change control to change a rotation speed of at least one of the first front wheel, the second front wheel, the first rear wheel, and the second rear wheel before or when the transport vehicle enters the at least one curved zone, based on the distance-to-curve included in the curve ahead information stored in the storage section and an actual distance traveled by the transport vehicle from when the curve ahead detection target was detected.

In the case where the first front wheel and the second front wheel have entered the curved zone, but the first rear wheel and the second rear wheel rearward thereof have not entered the curved zone and are still in the straight zone, a rotation speed difference (front-rear rotation speed difference) arises between the rotation speed of the first rear wheel and the second rear wheel and the rotation speed of at least either the first front wheel or the second front wheel. In other words, compared with the distance that the first rear wheel and the second rear wheel roll in the straight zone, out of the first front wheel and the second front wheel, the traveling wheel on the inward side of the curved zone rolls a shorter distance, and the traveling wheel on the outward side of the curved zone rolls a longer distance. According to this configuration, by using this phenomenon, the determination section can accurately determine that the transport vehicle has entered the curved zone, that is to say can accurately determine the starting point of the curved zone. The measurement section measures the distance-to-curve based on the determination result obtained by the determination section. The distance-to-curve corresponds to the distance that the transport vehicle travels from when the detection target is detected until when the starting point of the curved zone is reached. The distance-to-curve measured in this way is stored together with the identification information of the curve ahead detection target as curve ahead information in the storage section. In the case where the transport vehicle subsequently travels in the same curved zone, the travel control section executes speed change control to change the rotation speeds of the traveling wheels before or when the transport vehicle enters the curved zone, based on the stored curve ahead information. As described above, according to this configuration, the curve ahead information can be generated based on the position of the curved zone determined by using the phenomenon in which the front-rear rotation speed difference arises, and, based on the curve ahead information, highly accurate speed change control can be executed in accordance with the accurate position of the curved zone. Also, since the stored curve ahead information is used at this time, highly accurate speed change control can be executed even at a stage before or when entering a curved zone for which entry into the curved zone cannot be determined by the determination section.

Further features and advantages of the technology according to the present disclosure will become clearer from the following description of exemplary and non-limiting embodiments described with reference to the accompanying drawings.

BRIEF DESCRIPTION OF THE DRAWINGS

FIG. 1 is a plan view showing part of a travel route.
FIG. 2 is a plan view showing part of the travel route.
FIG. 3 is a perspective view of a transport vehicle.
FIG. 4 is a traveling direction view of part of the transport vehicle.
FIG. 7 is a diagram showing change over time in the rotation speed of a traveling wheel.

DESCRIPTION OF THE INVENTION

Embodiments of an article transport facility will be described below with reference to the drawings.

Figure 5:
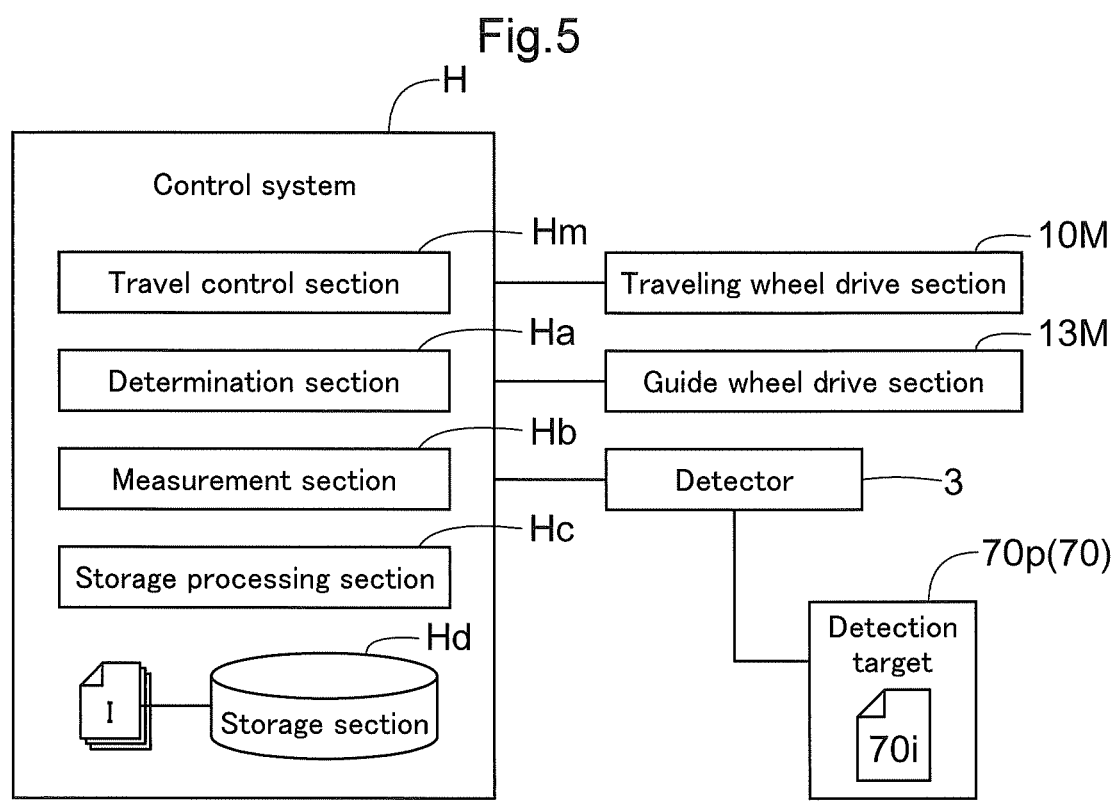
FIG. 5 is a control block diagram.

As shown in FIGS. 1 to 3, an article transport facility 100 includes a pair of travel rails 90 extending along a travel route R having straight zones Rs and a curved zone Rc, a transport vehicle V that travels along the travel route R and transports an article W, and a control system H that controls the transport vehicle V (see FIG. 5).

In the following description, "traveling direction X" is defined as the direction along the travel route R, and "width direction Y" is defined as the direction orthogonal to traveling direction X as viewed in the vertical direction. Also, "first side Y1 in the width direction" is defined as one side in the width direction Y, and "second side Y2 in the width direction" is defined as the other side in the width direction Y For example, the first side Y1 in the width direction refers to the left side with respect to the traveling direction of the transport vehicle V, and the second side Y2 in the width direction refers to the opposite side, which is the right side. However, the first side Y1 in the width direction and the second side Y2 in the width direction are not intended to specify only either the left or right side. The first side Y1 in the width direction may refer to the right side, and the second side Y2 in the width direction may refer to the left side.

As shown in FIGS. 1 and 2, the straight zones Rs are zones shaped as a straight line when viewed in the vertical direction. The curved zone Rc is a zone that is shaped as a curved line when viewed in the vertical direction. Although not shown in detail, the travel route R includes a plurality of straight zones Rs and a plurality of curved zones Rc. The straight zones Rs include multiple types of straight zones Rs having different lengths and extending directions. The curved zones Rc include multiple types of curved zones Rc having different lengths and curvatures.

The pair of travel rails 90 extend along the travel route R at positions spaced apart from each other in the width direction Y Out of the two travel rails 90, the travel rail 90 arranged on the first side Y1 in the width direction is a first travel rail 91, and the travel rail 90 arranged on the second side Y2 in the width direction is a second travel rail 92. Note that hereinafter, the first travel rail 91 and the second travel rail 92 may simply be collectively referred to as the travel rails 90.

Detection targets 70 are provided at a plurality of locations along the travel route R. Specifically, detection targets 70 are provided along the travel route R at a plurality of locations spaced apart in the traveling direction X. The detection targets 70 are for detection by a detector 3 (described later) of the transport vehicle V. Note that FIGS. 1 and 2 show part of the travel route R, and only one detection target 70 is shown in the drawings.

Unique identification information 70$i$ (see FIG. 5) is set in each of the detection targets 70. In this example, the identification information 70$i$ includes address information indicating the position where the detection target 70 is provided. In the present embodiment, by detecting the detection target 70 with the detector 3, the transport vehicle V can determine the position where the detection target 70 is provided, that is to say the current position of the corresponding vehicle at the time when the detection target was detected. For example, a one-dimensional code or a two-dimensional code storing the identification information 70$i$ can be used as the detection target 70. Alternatively, an RFID tag (Radio Frequency Identification Tag) storing the identification information 70$i$ can be used as the detection target 70.

Hereinafter, among the detection targets 70, the detection target 70 provided ahead of the curved zone Rc in the traveling direction X will be referred to as a curve ahead detection target 70p. In the illustrated example, the curve ahead detection target 70p is the detection target 70 provided at location that is ahead of the curved zone Rc in the traveling direction X and in the immediate vicinity of the curved zone Rc.

In the present embodiment, a guide rail 80 that guides the route of the transport vehicle V extends along the extending direction of the curved zone Rc at a different position than the pair of travel rails 90 in the vertical direction. Note that part of the guide rail 80 may protrude beyond the curved zone Rc and extend into a straight zone Rs.

As shown in FIG. 4, the guide rail 80 is arranged above the pair of travel rails 90 in the present embodiment. Also, the guide rail 80 is arranged between the pair of travel rails 90 in the width direction Y The guide rail 80 includes a first side surface 81 that faces the first side Y1 in the width direction and a second side surface 82 that faces the second side Y2 in the width direction. In this example, both the first side surface 81 and the second side surface 82 are extend along the vertical direction and the traveling direction X. The first side surface 81 and the second side surface 82 are rolling surfaces on which guide wheels 13 (described later) of the transport vehicle V roll.

In the present embodiment, the transport vehicle V is configured as an overhead transport vehicle that transports an article W along the travel route R set in the vicinity of the ceiling. The article W is an object to be transferred by the transport vehicle V, and is, for example, a FOUP (Front Opening Unified Pod) accommodating a semiconductor wafer, a reticle pod containing a reticle, or the like.

The transport vehicle V includes traveling wheels 10 that roll on the upper surfaces of the pair of travel rails 90, and a traveling wheel drive section 10M that drives the traveling wheels 10. The transport vehicle V travels along the travel route R by the traveling wheels 10 rolling on the upper surfaces of the travel rails 90. The traveling wheel drive section 10M is constituted using an electric motor such as a servomotor, for example.

The traveling wheels 10 include a first front wheel 11f and a second front wheel 12f arranged side by side in the width direction Y, and a first rear wheel 11r and a second rear wheel 12r arranged side by side in the width direction Y at positions rearward of the first front wheel 11f and the second front wheel 12f in the traveling direction X.

The first front wheel 11f and the first rear wheel 11r roll on the upper surface of the first travel rail 91. The second front wheel 12f and the second rear wheel 12r roll on the upper surface of the second travel rail 92.

In the present embodiment, the first front wheel 11f and the second front wheel 12f, which are arranged side by side in the width direction Y, are coupled to the same shaft (not shown) and driven to rotate at the same speed. The first rear wheel 11r and the second rear wheel 12r, which are arranged side by side in the width direction Y, are coupled to the same shaft (not shown) and driven to rotate at the same speed. Note that hereinafter, the first front wheel 11f, the second front wheel 12f, the first rear wheel 11r, and the second rear wheel 12r will sometimes be collectively referred to as the traveling wheels 10.

In the present embodiment, the transport vehicle V includes guide wheels 13 that roll on the first side surface 81, which faces the first side Y1 in the width direction, or the second side surface 82, which faces the second side Y2 in the width direction, of the guide rail 80, and a guide wheel drive section 13M for driving the guide wheels 13. The transport vehicle V is guided along the travel route R by the guide wheels 13 rolling on the first side surface 81 or the second side surface 82 of the guide rail 80. The guide wheel drive section 13M moves the guide wheels 13 along the width direction Y by applying force in the width direction Y Accordingly, the guide wheel drive section 13M changes the position of the guide wheels 13 in the width direction Y to either a first position set on the first side Y1 in the width direction of the center of a traveling section 1 in the width direction Y, or a second position set on the second side Y2 in the width direction of the center of the traveling section 1 in the width direction Y The guide wheel drive section 13M is constituted using, for example, a rotary solenoid, and changes the position of the guide wheels 13 in the width direction Yin accordance with a power supply state.

In the present embodiment, the guide wheels 13 include a front guide wheel 13f and a rear guide wheel 13r that is arranged rearward of the front guide wheel 13f in the traveling direction X. In the illustrated example, the two front guide wheels 13f are arranged side by side so as to be adjacent to each other in the traveling direction X. Also, two rear guide wheels 13r are arranged side by side so as to be adjacent to each other in the traveling direction X.

In the present embodiment, the transport vehicle V includes a plurality of auxiliary wheels 14 that roll on guide surfaces formed on the inward sides of the travel rails 90 in the width direction Y In the present embodiment, some of the auxiliary wheels 14 roll on the guide surface of the first travel rail 91 (in this example, the vertical surface that faces the second side Y2 in the width direction). The other auxiliary wheels 14 roll on the guide surface of the second travel rail 92 (in this example, the vertical surface that faces the first side Y1 in the width direction). The auxiliary wheels 14 roll on the guide surfaces of the travel rails 90 while the transport vehicle V travels along the travel route R. Accordingly, the transport vehicle V is appropriately guided along the travel route R, and the posture of the transport vehicle V is easily maintained in a horizontal posture.

In the present embodiment, the transport vehicle V includes a traveling section 1 and a body section 2. The traveling section 1 is a section that allows the transport vehicle V to travel, and is arranged above the travel rails 90. The body portion 2 is coupled to the traveling section 1 and arranged below the travel rails 90. In this example, the body section 2 supports the article W. The article W is supported by the body section 2 while being transported by the transport vehicle V.

In the present embodiment, the traveling section 1 includes a front traveling section 1F and a rear traveling section 1R that is arranged rearward of the front traveling section 1F in the traveling direction X. In this example, the first front wheel 11f and the second front wheel 12f are supported by the front traveling section 1F. Also, the front guide wheel 13f and a portion of the auxiliary wheels 14 are supported by the front traveling section 1F. The first rear wheel 11r and the second rear wheel 12r are supported by the rear traveling section 1R. Also, the rear guide wheel 13r and a portion of the auxiliary wheels 14 are supported by the rear traveling section 1R.

The transport vehicle V includes the detector 3 that detects the detection targets 70 provided at various locations on the travel route R. In this example, as described above, by detecting a detection target 70 with use of the detector 3, the transport vehicle V acquires the address information (identification information 70i) of the detection target 70 and determines the current position of the corresponding vehicle. If a one-dimensional code or a two-dimensional code is used as the detection target 70, a one-dimensional code reader or a two-dimensional code reader can be used as the detector 3.

Also, if an RFID tag is used as the detection target section 70, an RFID reader can be used as the detector 3.

In the present embodiment, in the straight zones Rs, the traveling speed of the transport vehicle V is controlled in accordance with a straight zone traveling speed Vs (see FIG. 1). Also, in the curved zones Rc, the traveling speed of the transport vehicle V is controlled in accordance with a curved zone traveling speed Vc (see FIG. 2). For example, the curved zone traveling speed Vc is lower than the straight zone traveling speed Vs. The traveling speed of the transport vehicle V is controlled by controlling the rotation speed of the traveling wheels 10.

When traveling in a straight zone Rs, the transport vehicle V travels in a two-side rolling state in which the first front wheel 11f and the first rear wheel 11r roll on the upper surface of the first travel rail 91 and furthermore the second front wheel 12f and the second rear wheel 12r roll on the upper surface of the second travel rail 92.

As shown in FIG. 4, when traveling in a curved zone Rc, the transport vehicle V travels in a one-side rolling state in which the guide wheels 13 roll on the first side surface 81 or the second side surface 82 of the guide rail 80, and, out of a set of wheels including the first front wheel 11f and the first rear wheel 11r and a set of wheels including the second front wheel 12f and the second rear wheel 12r, one set of wheels roll on the upper surface of the corresponding travel rail 90, and the other set of wheels are separated from the corresponding travel rail 90. FIG. 4 illustrates a one-side rolling state in which the front guide wheel 13f rolls on the second side surface 82 of the guide rail 80, the second front wheel 12f rolls on the upper surface of the second travel rail 92, and the first front wheel 11f is separated from the first travel rail 91.

As shown in FIG. 4, in the curved zone Rc, out of the two travel rails 90, the upper surface of one travel rail 90 (the upper surface of the first travel rail 91 in the illustrated example) includes a recessed section 93 that extends in the traveling direction X. Accordingly, the transport vehicle V is in a one-side rolling state in which the traveling wheels 10 on the side corresponding to the travel rail 90 provided with the recessed section 93 are separated from that travel rail 90.

In the curved zone Rc, the travel rail 90 arranged on the inward side in the width direction Y and the travel rail 90 arranged on the outward side in the width direction Y have different lengths in the traveling direction X. As described above, in this example, two traveling wheels 10 arranged side by side in the width direction Y (e.g., the first front wheel 11f and the second front wheel 12f) are driven to rotate at the same speed. Since two traveling wheels 10 that are driven to rotate at the same speed cannot roll different distances, the transport vehicle V travels in the one-side rolling state in the curved zone Rc. Accordingly, even though the transport vehicle V has a configuration in which two traveling wheels 10 arranged side by side in the width direction Y are driven to rotate at the same speed, the transport vehicle V can travel appropriately in the curved zone Rc.

As described above, as shown in FIG. 5, the article transport facility 100 includes the control system H that controls the transport vehicle V Although not shown in detail, the control system H includes a control device provided in the transport vehicle V and a host controller that is provided separately from the transport vehicle V and manages all or part of the equipment. However, the control system H may be constituted by only the control device provided in the transport vehicle V. The control system H includes a processor such as a microcomputer and peripheral circuitry such as a memory, for example. Various functions are realized through cooperation between such hardware and a program executed by a processor of a computer or the like.

The control system H acquires detection results obtained by the detector 3. In this example, upon detecting the curve ahead detection target 70p, the detector 3 reads the identification information 70i set in the curve ahead detection target 70p. For this reason, in this example, the control system H acquires the identification information 70i of the curve ahead detection target 70p read by the detector 3. As described above, the identification information 70i includes address information indicating the position where the curve ahead detection target 70p is provided. By acquiring the identification information 70i, the control system H determines which one of the curved zones Rc corresponds to the curve ahead detection target 70p in which the identification information 70i is stored, and also determines the current position of the transport vehicle V.

Figure 6:
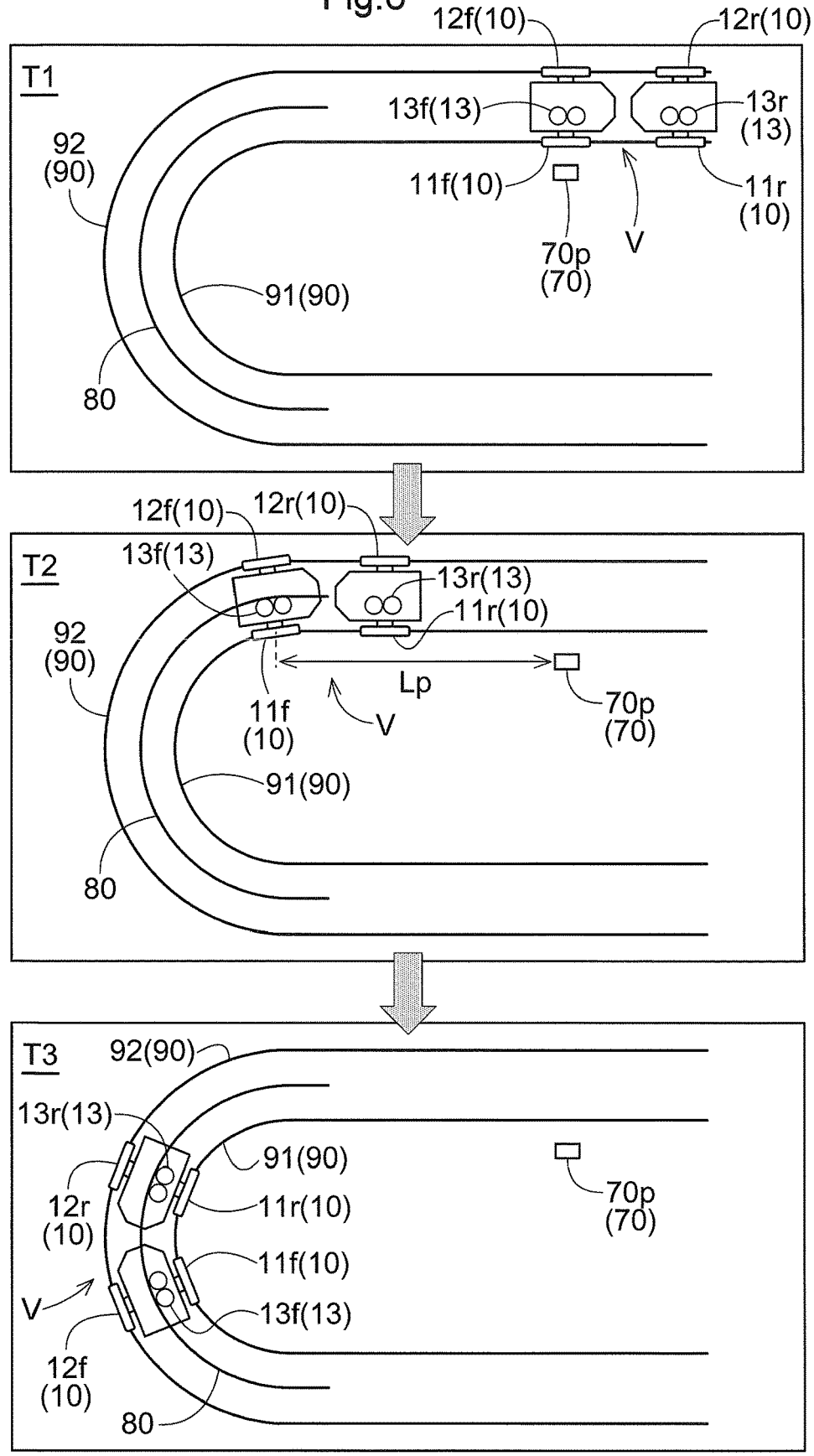
FIG. 6 is a diagram chronologically showing a scene in which a transport vehicle travels from a straight zone to a curved zone.

In the present embodiment, the detector 3 detects the curve ahead detection target 70p at a time T1 shown in FIGS. 6 and 7. In other words, the time T1 is a detection time Td at which the curve ahead detection target 70p is detected by the detector 3.

As shown in FIG. 5, the control system H includes a determination section Ha, a measurement section Hb, a storage processing section Hc, a storage section Hd, and a travel control section Hm.

The determination section Ha determines that the transport vehicle V entered a curved zone Rc from a straight zone Rs based on a front-rear rotation speed difference, which is the difference between a rotation speed Nr of the first rear wheel 11r and the second rear wheel 12r (see FIG. 7) and a rotation speed Nf of at least either the first front wheel 11f or the second front wheel 12f (see FIG. 7). The rotation speed Nf and the rotation speed Nr are expressed in terms of number of rotations per unit time, such as [rpm].

In the case where the first front wheel 11f and the second front wheel 12f have entered the curved zone Rc, but the first rear wheel 11r and the second rear wheel 12r rearward thereof have not entered the curved zone Rc and are still in the straight zone Rs, a rotation speed difference (front-rear rotation speed difference) arises between the rotation speed Nr of the first rear wheel 11r and the second rear wheel 12r and the rotation speed Nf of at least either the first front wheel 11f or the second front wheel 12f In other words, compared with the distance that the first rear wheel 11r and the second rear wheel 12r roll in the straight zone Rs, out of the first front wheel 11f and the second front wheel 12f, the traveling wheel 10 on the inward side of the curved zone Rc rolls a shorter distance, and the traveling wheel 10 on the outward side of the curved zone Rc rolls a longer distance. By using this phenomenon, the determination section Ha can accurately determine that the transport vehicle V has entered the curved zone Rc, that is to say can accurately determine the starting point of the curved zone Rc.

As described above, in the present embodiment, the transport vehicle V travels in the one-side rolling state in the curved zone Rc. For this reason, the determination section Ha determines that the transport vehicle V entered the curved zone Rc from the straight zone Rs based on the front-rear rotation speed difference between the rotation speed Nr of the first rear wheel 11r and the second rear wheel 12r rolling on the travel rails 90 and the rotation speed Nf of whichever one of the first front wheel 11f and the second front wheel 12f is rolling on the corresponding travel rail 90. In this example, the determination section Ha makes the above determination based on the front-rear rotation speed difference between the rotation speed Nr of the first rear wheel 11r and the second rear wheel 12r and the rotation speed Nf of the first front wheel 11f rolling on the first travel rail 91.

In the present embodiment, at a time T2 shown in FIGS. 6 and 7, the front-rear rotation speed difference starts to arise, and the determination section Ha determines that the transport vehicle V has entered the curved zone Rc. In other words, the time T2 is an entry start time Tc at which the transport vehicle V starts to enter the curved zone Rc.

In the present embodiment, the measurement section Hb measures the rotation speed Nf of the first front wheel 11f (and the second front wheel 12f) and the rotation speed Nr of the first rear wheel 11r and the second rear wheel 12r. The measurement section Hb is constituted using a rotary encoder, for example. In this example, the measurement section Hb measures the rotation speed of the traveling wheels 10 and the travel distance of the transport vehicle V.

The measurement section Hb measures a distance-to-curve Lp (see FIG. 6), which is the distance traveled by the transport vehicle V from when the curve ahead detection target 70p (detection target 70) is detected by the detector 3 until when the determination section Ha determines that the transport vehicle V entered the curved zone Rc from the straight zone Rs. In the present embodiment, as shown in FIGS. 6 and 7, the detection time Td is the time T1 at which the detector 3 detects the curve ahead detection target 70p, the entry start time Tc is the time T2 at which the determination section Ha determined that the transport vehicle V entered the curved zone Rc from the straight zone Rs, and the measurement section Hb measures the distance-to-curve Lp based on the number of rotations (rotation amount) of the traveling wheels 10 in an elapse period Tp from the detection time Td to the entry start time Tc.

The storage processing section He associates the distance-to-curve Lp with the unique identification information 70i that is set in the curve ahead detection target 70p and was used to measure the distance-to-curve Lp, and stores the distance-to-curve Lp and the identification information 70i as curve ahead information I in the storage section Hd. In the present embodiment, the storage processing section He stores the identification information 70i read by the detector 3 as the curve ahead information I in the storage section Hd. Also, the storage processing section He stores the distance-to-curve Lp measured by the measurement section Hb as the curve ahead information I in the storage section Hd.

In the present embodiment, the measurement section Hb measures the distance-to-curve Lp for each of the curved zones Rc provided on the travel route R. For each of the curved zones Rc, the storage processing section He stores the curve ahead information I, which includes the identification information 70i set in the curve ahead detection target 70p and the distance-to-curve Lp, in the storage section Hd.

The travel control section Hm controls the traveling of the transport vehicle V. In the present embodiment, the travel control section Hm controls the traveling wheel drive section 10M and the guide wheel drive section 13M.

The travel control section Hm controls the rotation speed of the traveling wheels 10, and thus the traveling speed of the transport vehicle V, by controlling the traveling wheel drive section 10M. In this example, the travel control section Hm controls the traveling wheel drive section 10M such that the traveling speed of the transport vehicle V is at the straight zone traveling speed Vs (see FIG. 1) in the straight zones Rs. Also, the travel control section Hm controls the traveling wheel drive section 10M such that the traveling speed of the transport vehicle V is at the curved zone traveling speed Vc (see FIG. 2) in the curved zone Rc. Strictly speaking, it is preferable that the traveling speed of the transport vehicle V is set to the curved zone traveling speed Vc before the transport vehicle V enters the curved zone Rc. For this reason, the travel control section Hm controls the traveling wheel drive section 10M such that the traveling speed of the transport vehicle V reaches the curved zone traveling speed Vc at a position before the curved zone Rc.

The travel control section Hm controls the travel direction of the transport vehicle V by controlling the guide wheel drive section 13M. The travel direction of the transport vehicle V differs depending on whether the guide wheels 13 roll on the first side surface 81 or the second side surface 82. In this example, by controlling the guide wheel drive section 13M, the travel control section Hm causes the guide wheels 13 to roll on the first side surface 81 or the second side surface 82 of the guide rail 80 by changing or maintaining the position of the guide wheels 13 in the width direction Y. In the present embodiment, based on the transport route designated for transporting the article W and the current position of the transport vehicle V when the detection target 70 was detected, the travel control section Hm controls the guide wheel drive section 13M such that the position of the guide wheels 13 in the width direction Y is set to a position corresponding to the travel direction of the transport vehicle V, at a time before or when the transport vehicle V enters the curved zone Rc. In the present embodiment, the guide wheel drive section 13M is controlled such that, at a time before or when the transport vehicle V enters the curved zone Rc, if the curved zone Rc is a right curved zone, the guide wheels 13 are arranged at a position for rolling on the second side surface 82, whereas if the curved zone Rc is a left curved zone, the guide wheels 13 are arranged at a position for rolling on the first side surface 81. Note that the "transport route" mentioned above may be stored in advance in the storage section Hd, or may be included in a transport command from the host controller (not shown). As described above, in the present embodiment, the control of the traveling wheel drive section 10M and the control of the guide wheel drive section 13M are performed separately by the travel control section Hm, but both of such control may be performed at the same time, or may be performed at different times.

Here, FIG. 6 chronologically shows a scene in which the transport vehicle V travels from a straight zone Rs to the curved zone Rc, and more specifically shows positions of the transport vehicle V at the time T1, the time T2, and a time T3. FIG. 7 shows change over time in the rotation speed of the traveling wheels 10, and more specifically shows change over time in the rotation speed Nr of the first rear wheel 11r and the second rear wheel 12r and the rotation speed Nf of the first front wheel 11f rolling on the upper surface of one of the two travel rails 90, specifically the first travel rail 91 arranged on the inward side in the width direction Y in the curved zone Rc.

At the time T1, the curve ahead detection target 70p is detected by the detector 3. In other words, the time T1 is the detection time Td at which the curve ahead detection target 70p is detected by the detector 3.

At the time T2, the first front wheel 11f and the second front wheel 12f start to enter the curved zone Rc. In other words, the time T2 is the entry start time Tc at which the first front wheel 11f and the second front wheel 12f start to enter the curved zone Rc. At the entry start time Tc, the first rear wheel 11r and the second rear wheel 12r have not yet entered the curved zone Rc and are still in the straight zone Rs. For this reason, as shown in FIG. 7, at the entry start time Tc, the rotation speed Nf of the first front wheel 11f begins to fall below the rotation speed Nr of the first rear wheel 11r and the second rear wheel 12r, and rotation speed difference between the rotation speeds (front-rear rotation speed difference) starts to arise. As described above, the measurement section Hb measures the rotation speed Nf of the first front wheel 11f (and the second front wheel 12f) and the rotation speed Nr of the first rear wheel 11r and the second rear wheel 12r. For this reason, based on the measurement result of the measurement section Hb, the determination section Ha recognizes that the front-rear rotation speed difference has arisen, and determines that the transport vehicle V has entered the curved zone Rc from the straight zone Rs.

The measurement section Hb then measures the distance-to-curve Lp based on the number of rotations (rotation amount) of the traveling wheels 10 during the elapse period Tp from the detection time Td (T1) to the entry start time Tc (T2). The measured distance-to-curve Lp is stored together with the identification information 70i of the curve ahead detection target 70p as the curve ahead information I in the storage section Hd.

At the time T3, the first front wheel 11f, the second front wheel 12f, the first rear wheel 11r, and the second rear wheel 12r are located in the curved zone Rc. At the time T3, the rotation speed Nf of the first front wheel 11f and the rotation speed Nr of the first rear wheel 11r and the second rear wheel 12r become the same or substantially the same, and ideally, there is no rotation speed difference between the rotation speeds (front-rear rotation speed difference).

In this way, in the case where the transport vehicle V enters the curved zone Rc from the straight zone Rs, the control system H acquires the curve ahead information I regarding the curved zone Rc and stores the acquired information in the storage section Hd. Specifically, the control system H acquires the distance-to-curve Lp, which is the distance traveled by the transport vehicle V from when the curve ahead detection target 70p is detected by the detector 3 until when the determination section Ha determines that the transport vehicle V entered the curved zone Rc from the straight zone Rs, and stores the acquired distance-to-curve Lp in the storage section Hd.

At a time before or when the transport vehicle V then passes through the curved zone Rc, the travel control section Hm executes speed change control to change the rotation speed of the traveling wheels 10, at a time before the transport vehicle V enters the curved zone Rc based on the curve ahead information I stored in advance in the storage section Hd. Accordingly, highly accurate speed change control can be executed in accordance with the accurate position of the curved zone Rc.

If the detector 3 detects the curve ahead detection target 70p while curve ahead information I is stored in the storage section Hd, then, based on the distance-to-curve Lp included in the curve ahead information I stored in the storage section Hd and the actual distance traveled by the transport vehicle V since detection of the curve ahead detection target 70p, the travel control section Hm executes speed change control to change the rotation speed of at least one wheel among the first front wheel 11f, the second front wheel 12f, the first rear wheel 11r, and the second rear wheel 12r at a time before or when the transport vehicle V enters the curved zone Rc. Here, the phrase "before or when the transport vehicle V enters the curved zone Rc" means "before the transport vehicle V enters the curved zone Rc" or "at the same time as the transport vehicle V enters the curved zone Rc". As described above, according to the present configuration, the curve ahead information I can be generated based on the position of the curved zone Rc determined with use of the phenomenon in which the front-rear rotation speed difference arises, and, based on the curve ahead information I, highly accurate speed change control can be executed in accordance with the accurate position of the curved zone Rc.

In the present embodiment, the travel control section Hm references a plurality of pieces of curve ahead information I stored in the storage section Hd, acquires, from the storage section Hd, the curve ahead information I that includes the same identification information 70i as the identification information 70i that was read when the detector 3 detected the curve ahead detection target 70p, and executes speed change control with use of the distance-to-curve Lp included in the acquired curve ahead information I. Accordingly, it is possible to execute highly accurate speed change control suitable for each of the plurality of curved zones Rc.

In the present embodiment, the speed change control executed by the travel control section Hm includes, concurrently with the first front wheel 11f and the second front wheel 12f entering the curved zone Rc from the straight zone Rs, changing the rotation speed Nf of the first front wheel 11f and the second front wheel 12f from the rotation speed for the straight zone Rs to the rotation speed for the curved zone Rc, and thereafter, concurrently with the first rear wheel 11r and the second rear wheel 12r entering the curved zone Rc from the straight zone Rs, changing the rotation speed Nr of the first rear wheel 11r and the second rear wheel 12r from the rotation speed for the straight zone Rs to the rotation speed for the curved zone Rc.

As described above, in the present embodiment, the transport vehicle V is in a one-side rolling state while traveling in the curved zone Rc. In this example, the speed change control executed by the travel control section Hm includes, concurrently with the first front wheel 11f and the second front wheel 12f entering the curved zone Rc from the straight zone Rs, changing the rotation speed Nf of whichever one of the first front wheel 11f and the second front wheel 12f is rolling on the upper surface of the corresponding travel rail 90 (here, the rotation speed Nf of the first front wheel 11f) from the rotation speed for the straight zone Rs to the rotation speed for the curved zone Rc, and thereafter, concurrently with the first rear wheel 11r and the second rear wheel 12r entering the curved zone Rc from the straight zone Rs, changing the rotation speed Nr of whichever one of the first rear wheel 11r and the second rear wheel 12r is rolling on the upper surface of the corresponding travel rail 90 (here, the rotation speed Nr of the first rear wheel 11r) from the rotation speed for the straight zone Rs to the rotation speed for the curved zone Rc. Accordingly, in the curved zone Rc, even in the case where the transport vehicle V is in a one-side rolling state in which a portion of the traveling wheels 10 are separated from the travel rails 90, by appropriately controlling the rotation speed of the traveling wheel 10 that is rolling on one of the travel rails 90 based on the curve ahead information I stored in the storage section Hd, it is possible to execute highly accurate speed change control in accordance with the accurate position of the curved zone Rc.

In the present embodiment, the speed change control executed by the travel control section Hm in the case where the transport vehicle V travels in the curved zone Rc includes changing the rotation speed of a traveling wheel 10 in the curved zone Rc relative to the rotation speed of that traveling wheel 10 in the straight zone Rs, in accordance with the ratio of the length of the travel rail 90 (the travel rail 90 on which the traveling wheel 10 is rolling) along the travel route R (hereinafter called a "second length") to the length of the curved zone Rc along the travel route R in the central section of the travel route R in the width direction Y (hereinafter called a "first length").

Here, the ratio of the second length to the first length is the same as or approximate to the ratio of the moving speed of the traveling wheel 10 to the moving speed of the central section of the transport vehicle V (the central section in the width direction Y, which similarly applies hereinafter). For this reason, by setting the rotation speed of the traveling wheel 10 in the curved zone Rc as described above, the moving speed of the central section of the transport vehicle V in the curved zone Rc can be brought closer to the moving speed of the central section of the transport vehicle V in the straight zone Rs. As a result, the change in speed of the central section of the transport vehicle V when passing through the boundary between the straight zone Rs and the curved zone Rc can be kept small, and vibration that may occur in the transport vehicle V and the article W transported by the transport vehicle V can be kept small.

Various control methods are conceivable as the speed change control performed by the travel control section Hm. Also, in addition to speed change control, it is conceivable to also execute other control related to speed change control (e.g., moving average control) before or when the transport vehicle V enters the curved zone Rc. In moving average control, in order for the traveling speed of the transport vehicle V to reach a target speed at a target position downstream of the current position of the transport vehicle V on the travel route R, the travel control section Hm generates reference speed commands in accordance with a traveling speed time-variation pattern in which the travel acceleration changes stepwise, generates a moving average command obtained from the moving average of the reference speed commands in a set period, and controls the rotation speed of the traveling wheels 10 based on the moving average command. Such moving average control is performed based on the distance-to-curve Lp included in the curve ahead information I stored in the storage section Hd. By executing the moving average control, in the case where the traveling speed of the transport vehicle V is changed from the straight zone traveling speed Vs to the curved zone traveling speed Vc at a position before the curved zone Rc, the traveling speed of the transport vehicle V can be changed gradually, and vibration of the transport vehicle V can be kept small. In the case of executing moving average control in this manner, it is preferable that the travel control section Hm ends the moving average control before or when the transport vehicle V enters the curved zone Rc. In this case, the travel control section Hm executes the above-described speed change control to change the rotation speed of at least one wheel among the first front wheel 11f, the second front wheel 12f, the first rear wheel 11r, and the second rear wheel 12r, at a time that is after the end of the moving average control and before or when the transport vehicle V enters the curved zone Rc.

According to the article transport facility 100 described above, it is possible to perform highly accurate travel control in accordance with the accurate position of the curved zone.

OTHER EMBODIMENTS

Next, other embodiments of the article transport facility will be described.

(1) In the above-described embodiment, an example is described in which the speed change control executed by the travel control section Hm includes, concurrently with the first front wheel 11f and the second front wheel 12f entering the curved zone Rc from the straight zone Rs, changing the rotation speed Nf of whichever one of the first front wheel 11f and the second front wheel 12f is rolling on the upper surface of the corresponding travel rail 90 from the rotation speed for the straight zone Rs to the rotation speed for the curved zone Rc, and thereafter, concurrently with the first rear wheel 11r and the second rear wheel 12r entering the curved zone Rc from the straight zone Rs, changing the rotation speed Nr of whichever one of the first rear wheel 11r and the second rear wheel 12r is rolling on the upper surface of the corresponding travel rail 90 from the rotation speed for the straight zone Rs to the rotation speed for the curved zone Rc. However, the present invention is not limited to this example, and, the speed change control executed by the travel control section Hm may be control for changing the rotation speeds of all of the traveling wheels 10 in the same period, at a time before or when the transport vehicle V enters the curved zone Rc. As another example, the speed change control executed by the travel control section Hm may be control for causing the traveling of the front traveling section 1F to conform with the traveling of the rear traveling section 1R, in order to change the rotation speed of at least one wheel among the first front wheel 11f, the second front wheel 12f, the first rear wheel 11r, and the second rear wheel 12r. Specifically, the travel control section Hm causes the traveling of the front traveling section 1F to conform with the traveling of the rear traveling section 1R by controlling the drive state of the first front wheel 11f and the second front wheel 12f so as to conform to the drive state of the first rear wheel 11r and the second rear wheel 12r. For example, the travel control section Hm causes the traveling of the front traveling section 1F to conform with the traveling of the rear traveling section 1R by controlling the drive torque of the first front wheel 11f and the second front wheel 12f from the traveling wheel drive section 10M. The travel control section Hm may cause the traveling of the front traveling section 1F to conform with the traveling of the rear traveling section 1R by setting the drive torque of the first front wheel 11f and the second front wheel 12f to zero (torque-free control). Specifically, the speed change control executed by the travel control section Hm may be control for, at a time before or when the transport vehicle V enters the curved zone Rc, setting a constant rotation speed for the first rear wheel 11r and the second rear wheel 12r, and causing the rotation speed of the first front wheel 11f and the second front wheel 12f to change in a conforming manner by setting the drive torque of the first front wheel 11f and the second front wheel 12f to a drive torque according to which the traveling of the front traveling section 1F conforms with the traveling of the rear traveling section 1R (e.g., a drive torque of zero). In this way, the change in the rotation speed of at least one wheel among the first front wheel 11f, the second front wheel 12f, the first rear wheel 11r, and the second rear wheel 12r in the speed change control may be conforming change (passive change) achieved by controlling the rotation speed of a traveling wheel 10 other than the at least one traveling wheel 10.

(2) In the above-described embodiment, an example is described in which the curve ahead detection target 70p is the detection target 70 that is provided at a location that is ahead of the curved zone Rc in the traveling direction X and in the immediate vicinity of the curved zone Rc, and the distance-to-curve Lp is measured based on the time when the curve ahead detection target 70p is detected. However, the present invention is not limited to this example, and the curve ahead detection target 70p is not limited to being the detection target 70 provided in the immediate vicinity of the curved zone Rc, and may be any detection target 70 provided ahead of the curved zone Rc in the traveling direction X. In this case, the distance-to-curve Lp may be measured based on the time when that curve ahead detection target 70p is detected.

(3) In the above-described embodiment, an example is described in which the storage processing section He stores, in the storage section Hd, the curve ahead information I, which includes the identification information 70i set in the curve ahead detection target 70p and the distance-to-curve Lp, for each of the curved zones Rc. However, the present invention is not limited to this example, and the storage processing section He may store, in the storage section Hd, the curve ahead information I, which includes the identification information 70i and the distance-to-curve Lp, only for a specified curved zone Rc among the curved zones Rc.

(4) In the above-described embodiment, an example is described in which, in the case of traveling in the curved zone Rc, the transport vehicle V travels in a one-side rolling state in which, out of a set of wheels including the first front wheel 11f and the first rear wheel 11r and a set of wheels including the second front wheel 12f and the second rear wheel 12r, one set of wheels roll on the upper surface of the corresponding travel rail 90, and the other set of wheels are separated from the corresponding travel rail 90. However, the present invention is not limited to this example, even in the case of traveling in the curved zone Rc, the transport vehicle V may travel in the two-side rolling state in which both the set of wheels including the first front wheel 11f and the first rear wheel 11r and the set of wheels including the second front wheel 12f and the second rear wheel 12r roll on the upper surfaces of the corresponding travel rails 90. In this case, it is preferable that the first front wheel 11f and the second front wheel 12f, which are arranged side by side in the width direction Y, are driven to rotate independently. Also, it is preferable that the first rear wheel 11r and the second rear wheel 12r, which are arranged side by side in the width direction Y, are driven to rotate independently.

(5) In the above-described embodiment, it is described that the curved zone Rc is a zone that is curved when viewed in the vertical direction. In the curved zone Rc, the pair of travel rails 90 may be curved with a constant curvature when viewed in the vertical direction, or may have different curvatures in different portions. As an example of having different curvatures in different portions, in the curved zone Rc, the pair of travel rails 90 may extend along a clothoid curve whose curvature changes at a constant rate.

(6) In the above-described embodiment, an example is described in which the transport vehicle V includes the guide wheels 13 that roll on the first side surface 81, which faces the first side Y1 in the width direction, or the second side surface 82, which faces the second side Y2 in the width direction, of the guide rail 80. However, the present invention is not limited to this example, and the transport vehicle V is not required to include the guide wheels 13 as described above. Also, in this case, the article transport facility 100 is not required to be provided with the guide rail 80.

(7) Note that the configurations disclosed in the above-described embodiments can also be applied in combination with configurations disclosed in other embodiments as long as no contradiction arises. The embodiments disclosed in this specification, including such other configurations, are merely examples in all respects. Accordingly, various modifications can be made as appropriate without departing from the scope of the present disclosure.

Overview of Embodiments

The following describes aspects of the article transport facility described above.

An article transport facility includes:
a pair of travel rails extending along a travel route having a straight zone and at least one curved zone;
a transport vehicle configured to travel along the travel route and transport an article; and
a control system configured to control the transport vehicle,
wherein one of the pair of travel rails is a first travel rail on a first side in a width direction orthogonal, when viewed in a vertical direction, to a traveling direction along the travel route, and another one of the pair of travel rails is a second travel rail on a second side in the width direction different from the first side in the width direction,
the transport vehicle includes a plurality of traveling wheels configured to roll on upper surfaces of the pair of travel rails, and a detector configured to detect a detection target on the travel route,
the plurality of traveling wheels include a first front wheel and a second front wheel side by side in the width direction, and a first rear wheel and a second rear wheel side by side in the width direction at positions rearward of the first front wheel and the second front wheel in the traveling direction,
the first front wheel and the first rear wheel are configured to roll on an upper surface of the first travel rail,
the second front wheel and the second rear wheel are configured to roll on an upper surface of the second travel rail,
the control system includes a determination section, a measurement section, a storage processing section, a storage section, and a travel control section,
the determination section is configured to determine that the transport vehicle entered the at least one curved zone from the straight zone, based on a front-rear rotation speed difference between (i) a rotation speed of the first rear wheel and the second rear wheel and (ii) a rotation speed of at least either the first front wheel or the second front wheel,
the measurement section is configured to measure a distance-to-curve indicating a distance the transport vehicle travels from when the detector detects the detection target until when the determination section determines that the transport vehicle entered the at least one curved zone from the straight zone,
the storage processing section is configured to associate the distance-to-curve with unique identification information set for a curve ahead detection target, which is the detection target used for measurement of the distance-to-curve, and store the distance-to-curve and the identification information as curve ahead information in the storage section, and
the travel control section is configured to, in response to the detector detecting the curve ahead detection target while the curve ahead information is stored in the storage section, execute speed change control to change a rotation speed of at least one of the first front wheel, the second front wheel, the first rear wheel, and the second rear wheel before or when the transport vehicle enters the at least one curved zone, based on the distance-to-curve included in the curve ahead information stored in the storage section and an actual distance traveled by the transport vehicle from when the curve ahead detection target was detected.

In the case where the first front wheel and the second front wheel have entered the curved zone, but the first rear wheel and the second rear wheel rearward thereof have not entered the curved zone and are still in the straight zone, a rotation speed difference (front-rear rotation speed difference) arises between the rotation speed of the first rear wheel and the second rear wheel and the rotation speed of at least either the first front wheel or the second front wheel. In other words, compared with the distance that the first rear wheel and the second rear wheel roll in the straight zone, out of the first front wheel and the second front wheel, the traveling wheel on the inward side of the curved zone rolls a shorter distance, and the traveling wheel on the outward side of the curved zone rolls a longer distance. According to this configuration, by using this phenomenon, the determination section can accurately determine that the transport vehicle has entered the curved zone, that is to say can accurately determine the starting point of the curved zone. The measurement section measures the distance-to-curve based on the determination result obtained by the determination section. The distance-to-curve corresponds to the distance that the transport vehicle travels from when the detection target is detected until when the starting point of the curved zone is reached. The distance-to-curve measured in this way is stored together with the identification information of the curve ahead detection target as curve ahead information in the storage section. In the case where the transport vehicle subsequently travels in the same curved zone, the travel control section executes speed change control to change the rotation speeds of the traveling wheels before or when the transport vehicle enters the curved zone, based on the stored curve ahead information. As described above, according to this configuration, the curve ahead information can be generated based on the position of the curved zone determined by using the phenomenon in which the front-rear rotation speed difference arises, and, based on the curve ahead information, highly accurate speed change control can be executed in accordance with the accurate position of the curved zone. Also, since the stored curve ahead information is used at this time, highly accurate speed change control can be executed even at a stage before or when entering a curved zone for which entry into the curved zone cannot be determined by the determination section.

It is preferable that the detector is further configured to, in response to detecting the curve ahead detection target, read the identification information set for the curve ahead detection target, the storage processing section stores the read identification information as the curve ahead information in the storage section, the at least one curved zone includes a plurality of curved zones along the travel route, and the measurement section measures the distance-to-curve for each of the plurality of curved zones, the storage processing section stores, in the storage section, a plurality of pieces of the curve ahead information in one-to-one correspondence with the plurality of curved zones, each of the pieces of curve ahead information including the identification information set for a corresponding curve ahead detection target and a corresponding distance-to-curve, and the travel control section references the plurality of pieces of curve ahead information stored in the storage section, acquires, from the storage section, the piece of curve ahead information including the identification information corresponding to the identification information read in response to the detector detecting the curve ahead detection target, and executes the speed change control with use of the distance-to-curve included in the acquired piece of curve ahead information.

According to this configuration, the curve ahead information is generated and stored for each of the curved zones, and the travel control section executes speed change control with use of corresponding unique curve ahead information for each of the curved zones. Therefore, according to this configuration, it is possible to execute highly accurate speed change control suitable for each of the curved zones.

It is preferable that the speed change control executed by the travel control section includes (i) concurrently with the first front wheel and the second front wheel entering the at least one curved zone from the straight zone, changing the rotation speed of the first front wheel and the second front wheel from a rotation speed for the straight zone to a rotation speed for the curved zone, and thereafter, (ii) concurrently with the first rear wheel and the second rear wheel entering the at least one curved zone from the straight zone, changing the rotation speed of the first rear wheel and the second rear wheel from a rotation speed for the straight zone to a rotation speed for the curved zone.

According to this configuration, when the transport vehicle enters the curved zone from the straight zone, the traveling speed of the transport vehicle overall can be stabilized, and the behavior of the transport vehicle can be made smooth.

It is preferable that the article transport facility further includes:

a guide rail configured to guide a path of the transport vehicle and extending in a direction in which the at least one curved zone extends, at a different position from the pair of travel rails in the vertical direction, the transport vehicle includes a guide wheel configured to roll on a first side surface or a second side surface of the guide rail, the first side surface facing the first side in the width direction, and the second side surface facing the second side in the width direction, while the transport vehicle travels in the straight zone, the transport vehicle travels in a two-side rolling state in which the first front wheel and the first rear wheel roll on an upper surface of the first travel rail and the second front wheel and the second rear wheel roll on an upper surface of the second travel rail, while the transport vehicle travels in the at least one curved zone, the transport vehicle travels in a one-side rolling state in which (i) the guide wheel rolls on the first side surface or the second side surface of the guide rail, and, (ii) out of a set of wheels including the first front wheel and the first rear wheel and a set of wheels including the second front wheel and the second rear wheel, one of the sets of wheels roll on the upper surface of the corresponding travel rail, and another one of the sets of wheels are separated from the corresponding travel rail, and the speed change control executed by the travel control section includes (i) concurrently with the first front wheel and the second front wheel entering the at least one curved zone from the straight zone, changing a rotation speed of whichever one of the first front wheel and the second front wheel is rolling on the upper surface of the corresponding rail from a rotation speed for the straight zone to a rotation speed for the curved zone, and thereafter, (ii) concurrently with the first rear wheel and the second rear wheel entering the at least one curved zone from the straight zone, changing the rotation speed of whichever one of the first rear wheel and the second rear wheel is rolling on the upper surface of the corresponding travel rail from a rotation speed for the straight zone to a rotation speed for the curved zone.

According to this configuration, even if the transport vehicle is in the one-side rolling state in which at least one of the traveling wheels is separated from the corresponding travel rail in the curved zone, by appropriately controlling the rotation speed of the traveling wheel that is rolling on the travel rail based on the curve ahead information stored in the storage section, it is possible to execute highly accurate speed change control based on the accurate position of the curved zone.

INDUSTRIAL APPLICABILITY

The technology according to the present disclosure is applicable to an article transport facility that includes a pair of travel rails extending along a travel route having a straight zone and a curved zone, a transport vehicle that travels along the travel route and transports articles, and a control system that controls the transport vehicle.

What is claimed is:

1. An article transport facility comprising:
    a pair of travel rails extending along a travel route having a straight zone and at least one curved zone;
    a transport vehicle configured to travel along the travel route and transport an article; and
    a control system configured to control the transport vehicle,
    wherein:
    one of the pair of travel rails is a first travel rail on a first side in a width direction orthogonal, when viewed in a vertical direction, to a traveling direction along the travel route, and another one of the pair of travel rails is a second travel rail on a second side in the width direction different from the first side in the width direction,
    the transport vehicle comprises a plurality of traveling wheels configured to roll on upper surfaces of the pair of travel rails, and a detector configured to detect a detection target on the travel route,
    the plurality of traveling wheels comprise a first front wheel and a second front wheel side by side in the width direction, and a first rear wheel and a second rear wheel side by side in the width direction at positions rearward of the first front wheel and the second front wheel in the traveling direction,
    the first front wheel and the first rear wheel are configured to roll on an upper surface of the first travel rail,
    the second front wheel and the second rear wheel are configured to roll on an upper surface of the second travel rail,
    the control system comprises a determination section, a measurement section, a storage processing section, a storage section, and a travel control section,
    the determination section is configured to determine that the transport vehicle entered the at least one curved zone from the straight zone, based on a front-rear rotation speed difference between (i) a rotation speed of the first rear wheel and the second rear wheel and (ii) a rotation speed of at least either the first front wheel or the second front wheel,
    the measurement section is configured to measure a distance-to-curve indicating a distance the transport vehicle travels from when the detector detects the detection target until when the determination section determines that the transport vehicle entered the at least one curved zone from the straight zone,
    the storage processing section is configured to associate the distance-to-curve with unique identification information set for a curve ahead detection target, which is the detection target used for measurement of the distance-to-curve, and store the distance-to-curve and the identification information as curve ahead information in the storage section, and
    the travel control section is configured to, in response to the detector detecting the curve ahead detection target while the curve ahead information is stored in the storage section, execute speed change control to change a rotation speed of at least one of the first front wheel, the second front wheel, the first rear wheel, and the second rear wheel before or when the transport vehicle enters the at least one curved zone, based on the distance-to-curve included in the curve ahead information stored in the storage section and an actual distance traveled by the transport vehicle from when the curve ahead detection target was detected.

2. The article transport facility according to claim 1, wherein:
    the detector is further configured to, in response to detecting the curve ahead detection target, read the identification information set for the curve ahead detection target,
    the storage processing section stores the read identification information as the curve ahead information in the storage section,
    the at least one curved zone includes a plurality of curved zones along the travel route, and the measurement section measures the distance-to-curve for each of the plurality of curved zones,
    the storage processing section stores, in the storage section, a plurality of pieces of the curve ahead information in one-to-one correspondence with the plurality of curved zones, each of the pieces of curve ahead information including the identification information set for a corresponding curve ahead detection target and a corresponding distance-to-curve, and
    the travel control section references the plurality of pieces of curve ahead information stored in the storage section, acquires, from the storage section, the piece of curve ahead information including the identification information corresponding to the identification information read in response to the detector detecting the curve ahead detection target, and executes the speed change control with use of the distance-to-curve included in the acquired piece of curve ahead information.

3. The article transport facility according to claim 1, wherein the speed change control executed by the travel control section includes (i) concurrently with the first front wheel and the second front wheel entering the at least one curved zone from the straight zone, changing the rotation speed of the first front wheel and the second front wheel from a rotation speed for the straight zone to a rotation speed for the curved zone and, thereafter, (ii) concurrently with the first rear wheel and the second rear wheel entering the at least one curved zone from the straight zone, changing the rotation speed of the first rear wheel and the second rear wheel from a rotation speed for the straight zone to a rotation speed for the curved zone.

4. The article transport facility according to claim 1, further comprising:
a guide rail configured to guide a path of the transport vehicle and extending in a direction in which the at least one curved zone extends, at a different position from the pair of travel rails in the vertical direction,
wherein:
the transport vehicle comprises a guide wheel configured to roll on a first side surface or a second side surface of the guide rail, the first side surface facing the first side in the width direction, and the second side surface facing the second side in the width direction,
while the transport vehicle travels in the straight zone, the transport vehicle travels in a two-side rolling state in which the first front wheel and the first rear wheel roll on an upper surface of the first travel rail and the second front wheel and the second rear wheel roll on an upper surface of the second travel rail,
while the transport vehicle travels in the at least one curved zone, the transport vehicle travels in a one-side rolling state in which (i) the guide wheel rolls on the first side surface or the second side surface of the guide rail, and (ii) out of a set of wheels including the first front wheel and the first rear wheel and a set of wheels including the second front wheel and the second rear wheel, one of the sets of wheels roll on the upper surface of the corresponding travel rail, and another one of the sets of wheels are separated from the corresponding travel rail, and
the speed change control executed by the travel control section includes (i) concurrently with the first front wheel and the second front wheel entering the at least one curved zone from the straight zone, changing a rotation speed of whichever one of the first front wheel and the second front wheel is rolling on the upper surface of the corresponding rail from a rotation speed for the straight zone to a rotation speed for the curved zone and, thereafter, (ii) concurrently with the first rear wheel and the second rear wheel entering the at least one curved zone from the straight zone, changing the rotation speed of whichever one of the first rear wheel and the second rear wheel is rolling on the upper surface of the corresponding travel rail from a rotation speed for the straight zone to a rotation speed for the curved zone.

* * * * *